United States Patent
Ito et al.

(10) Patent No.: US 9,343,291 B2
(45) Date of Patent: May 17, 2016

(54) METHOD FOR FORMING AN INTERFACIAL LAYER ON A SEMICONDUCTOR USING HYDROGEN PLASMA

(71) Applicant: Tokyo Electron Limited, Minato-ku, Tokyo (JP)

(72) Inventors: Toru Ito, Nirasaki (JP); Paul C. McIntyre, Sunnyvale, CA (US)

(73) Assignees: Tokyo Electron Limited, Tokyo (JP); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/274,935

(22) Filed: May 12, 2014

(65) Prior Publication Data

US 2014/0342575 A1 Nov. 20, 2014

Related U.S. Application Data

(60) Provisional application No. 61/823,777, filed on May 15, 2013.

(51) Int. Cl.
| | |
|---|---|
| H01L 21/31 | (2006.01) |
| H01L 21/02 | (2006.01) |
| H01L 21/28 | (2006.01) |
| H01J 37/32 | (2006.01) |
| H01L 29/51 | (2006.01) |

(52) U.S. Cl.
CPC ...... *H01L 21/02172* (2013.01); *H01L 21/0234* (2013.01); *H01L 21/28255* (2013.01); *H01L 21/28264* (2013.01); *H01J 37/32192* (2013.01); *H01L 29/517* (2013.01)

(58) Field of Classification Search
CPC .............. H01J 37/32935; H01L 21/02274; H01L 21/02172; H01L 21/28185; H01L 29/517
USPC .......... 438/763, 637, 438, 513, 591; 257/410, 257/637

See application file for complete search history.

(56) References Cited

U.S. PATENT DOCUMENTS

| | | | |
|---|---|---|---|
| 7,163,877 B2* | 1/2007 | Niimi et al. | 438/513 |
| 7,271,458 B2* | 9/2007 | Chui et al. | 257/410 |
| 8,313,994 B2* | 11/2012 | Clark | 438/216 |
| 2005/0136610 A1* | 6/2005 | Kitagawa et al. | 438/402 |
| 2006/0040483 A1* | 2/2006 | Niimi et al. | 438/591 |
| 2009/0085175 A1* | 4/2009 | Clark et al. | 257/637 |
| 2010/0248464 A1* | 9/2010 | Clark | 438/591 |
| 2012/0094505 A1* | 4/2012 | Nakamura | H01J 37/32192 438/771 |

OTHER PUBLICATIONS

Zhang et al., "Al2O3/GeOx/Ge gate stacks with low interface trap density fabricated by electron cyclotron resonance plasma postoxidation," Applied Physics Letters 98, 112902 (2011).*

* cited by examiner

*Primary Examiner* — Jae Lee
*Assistant Examiner* — Colleen E Snow

(57) ABSTRACT

Techniques include a method of forming an interfacial passivation layer between a first semiconductor material (such as germanium) and a high-k gate dielectric. Such techniques include using a hydrogen-based plasma formed using a slotted-plane antenna plasma processing system. Such a plasma treatment can be executed with substrate temperatures less than 380 degrees Celsius, and even down to about 200 degrees Celsius or below.

16 Claims, 5 Drawing Sheets

METHOD FOR FORMING AN INTERFACIAL LAYER ON A SEMICONDUCTOR USING HYDROGEN PLASMA

CROSS REFERENCE TO RELATED APPLICATIONS

The present application claims the benefit of U.S. Provisional Patent Application No. 61/823,777, filed on May 15, 2013, entitled "Method for Forming an Interfacial Layer on a Semiconductor Using Hydrogen Plasma," which is incorporated herein by reference in its entirety.

BACKGROUND OF THE INVENTION

Techniques herein relate to semiconductor fabrication, and more particularly, to forming protection layers.

Field Effect Transistors (FETs) are widely used in the electronics industry with varied processing applications including switching, amplification, filtering, and so forth. Metal Oxide Field Effect Transistors (MOSFETs) are a common type of FET device used in microelectronics. Transistor structures typically include a metal or polysilicon gate contact energized to create an electric field within a semiconductor channel, which allows current to conduct between source and drain regions.

Semiconductor fabrication techniques commonly use high-k dielectric materials for the gate dielectric layer along with metals other than polysilicon for the gate electrode. Such devices may be referred to as high-k/metal gate transistors. Interfacial layers or passivation layers can form between these layers. Depending on materials used, an interfacial layer can be beneficial or detrimental. Sometimes the formation of a given interfacial layer is unintended, while other times it is designed.

SUMMARY

Silicon has been the primary semiconductor material used in microelectronics. Expanding beyond use of silicon in semiconductor fabrication is helping to enable smaller and faster transistors. For example, using germanium (Ge) as a semiconductor material in microelectronics is becoming an important technology as integrated circuits shrink in size. Using germanium is beneficial because the mobility of electrons and holes of Ge semiconductors can be two-four times higher than that of silicon.

In an example fabrication technique, a gate insulator material is deposited over Ge and then this gate insulator material needs to be processed. Such processing conventionally involves one or more high temperature exposures either for dopant activation or annealing. Such high-temperature processes, however, can lead to diffusion of germanium and/or surface damage. To prevent diffusion, a protection layer or passivation layer can be formed between the germanium and the gate insulator. It is desirable to have this protection layer formed after depositing the gate insulator, and to form this protection layer at a low temperature to prevent thermal diffusion.

Conventionally thermal processing, however, is performed in furnaces, which can result in undesirable shrinking of materials. Such conventional protection layers that are formed in a furnace are typical processed using a formed gas anneal (FGA) process at a relatively high temperature in an environment of approximately 98% nitrogen and 2% hydrogen. Conventional techniques additionally include depositing a top electrode, such as platinum, on a substrate stack and using this electrode as a catalyst to help form a thin layer of germanium oxide. This catalyst electrode then needs to be removed from the stack, which increases cost and fabrication time.

Techniques disclosed herein include a method of forming an interfacial passivation layer between a first semiconductor material (such as germanium) and a high-k gate dielectric. Such techniques include using a hydrogen-based plasma formed using a slotted-plane antenna plasma processing system. Such a plasma treatment can be executed with substrate temperatures less than 380 degrees Celsius, and even down to about 200 degrees Celsius or below.

One embodiment includes a method of forming an interfacial passivation layer on a semiconductor layer of a substrate. This method includes depositing an insulation layer on a semiconductor layer of a substrate. The insulation layer can have a dielectric constant value greater than approximately 5. The substrate is disposed on a substrate holder in a plasma processing system. The plasma processing system has a slotted plane antenna that creates plasma via surface wave transmission of electromagnetic radiation. Then a process gas mixture is flowed into the plasma processing system. An interfacial passivation layer is then formed between the semiconductor layer and the insulation layer by forming a plasma from the process gas mixture such that the insulation layer is exposed to the plasma. During this plasma exposure, the substrate and/or plasma are maintained at a temperature less than about 380 degrees Celsius.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include methods for using a slotted plane antenna plasma processing system for treating high dielectric constant (high-k) materials for application with germanium, with III-V compounds, and with other related materials.

Figure 1A:
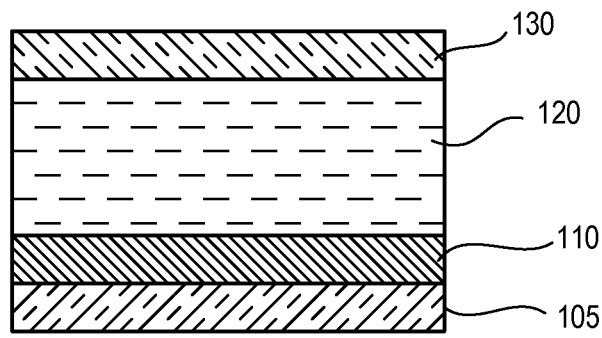
FIGS. 1A and 1B is a cross-sectional schematic view of a substrate stack segment according to embodiments disclosed herein.

Referring to FIG. 1A, techniques include receiving a substrate including a semiconductor layer 120 (such as a germanium layer) and an insulation layer 130 deposited on the semiconductor layer 120. The insulation layer 130 can include a high-k material (gate insulator) such as aluminum oxide. Position below the semiconductor layer can one or more underlying layers 105 and 110, which can be selected from varied materials depending on a particular fabrication scheme. Underlying layer 110 can be, for example, titanium, and underlying layer 105 can be, for example, aluminum.

Figure 1B:
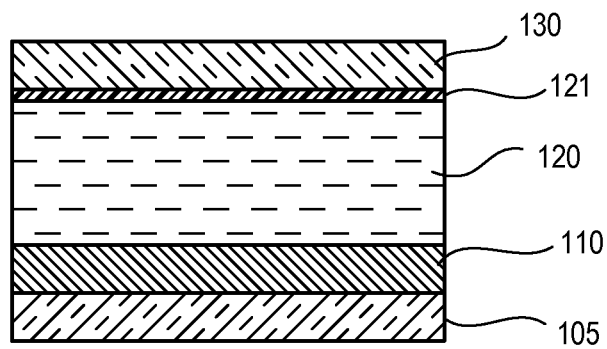

The substrate is positioned in a plasma chamber that uses a slotted-plane antenna to generate plasma. By way of a non-limiting example, a process gas mixture of Argon (600 sccm), H2 (18 sccm), and O2 (1.5 sccm) is flowed into a process chamber at a pressure of about 1-20 Torr with 1000-3000 watts of radio frequency power used to create plasma. Note that gas mixture ratios can be varied. The state temperature can be between about 200-380 degrees Celsius. Oxygen can be added to prevent an upper electrode of the process chamber from being damaged. Such upper electrodes can have silicon dioxide surface. By forming hydrogen radicals in the plasma, a metal electrode on the substrate is not needed to catalyze the formation of the thin protection layer. Hydrogen radicals are generated through the discharge, thus techniques herein do not require a metal layer as a catalyst, thereby accelerating the process. In other embodiments, however, a catalyst can still be used. Plasma can be formed in conditions that prevent sputtering of the high-k insulator layer. The plasma formed can promote or create a GeO2 bonding at the interface between, for example, Germanium and an aluminum oxide ($Al_2O_3$) capping layer. Using such a hydrogen plasma can decrease the interface trap density (Dit). Accordingly, as illustrated in FIG. 1B, interfacial layer 121 can be formed as a result of such a plasma treatment process.

The plasma chamber can be a slot plane antenna and/or processing system that generates plasma via surface wave transmission. With such a plasma processing system, plasma densities can be achieved greater than 1012 (cm−3), with low electron temperature, such as less than 1.5 eV, as well as having a low process temperature of less than 400 degrees Celsius. Alternatively, electron cyclotron resonance (ECR) oxygen plasma can be used.

In one example flow, a process can begin with deionized water cleaning for about 5 minutes of the substrate in FIG. 1A (prior to depositing layer 130). Cleaning can be followed by water pre-pulsing of about 50 cycles at 270 C. Al2O3 can then be deposited via atomic layer deposition of about 6 nanometers, with 100 cycles at about 270 C. Next a plasma treatment step can be executed using flowing a process gas mixture of argon, H2, and O2, to form an interfacial passivation or protection layer 121. After plasma treatment, an upper metal (Pt, Ti/Al) or electrode layer (if used) can be evaporated. Note that such techniques are substantially unaffected by a particular type of gate metal material.

One example embodiment includes a method of forming an interfacial passivation layer on a semiconductor layer of a substrate. The method can include depositing an insulation layer on a semiconductor layer of a substrate. The insulation layer (a gate insulator of a field effect transistor) has a dielectric constant value greater than approximately 5. The substrate is then disposed a substrate holder in a plasma processing system, such as a wafer holder or chuck. The plasma processing system has a slotted plane antenna that creates plasma via surface wave transmission of electromagnetic radiation. A process gas mixture is flow into the plasma processing system. An interfacial passivation layer is then formed between the semiconductor layer and the insulation layer by forming plasma from the process gas mixture (for example, above the substrate) such that the insulation layer is exposed to the plasma. This plasma exposure process is executed with the substrate and/or plasma being maintained at a temperature less than about 380 degrees Celsius.

Example process gas mixtures can comprises a hydrogen gas including H2. The process gas mixture can also comprises an oxygen gas, such as $O_2$. In some embodiments, a ratio of hydrogen gas to oxygen gas is greater than about ten to one. The process gas mixture can also include a noble gas or other carrier gas. In some embodiments the oxygen gas comprises less than about five percent of the process gas mixture.

The insulation layer can be selected from various materials including aluminum oxide, hafnium oxide (HfO2), zirconium oxide (ZrO2), titanium oxide (TiO2), etc. The semiconductor layer can be a channel of a field effect transistor. The semiconductor layer can include germanium or doped germanium, or a III-V compound. The created interfacial passivation layer can comprise germanium oxide.

Figure 2:
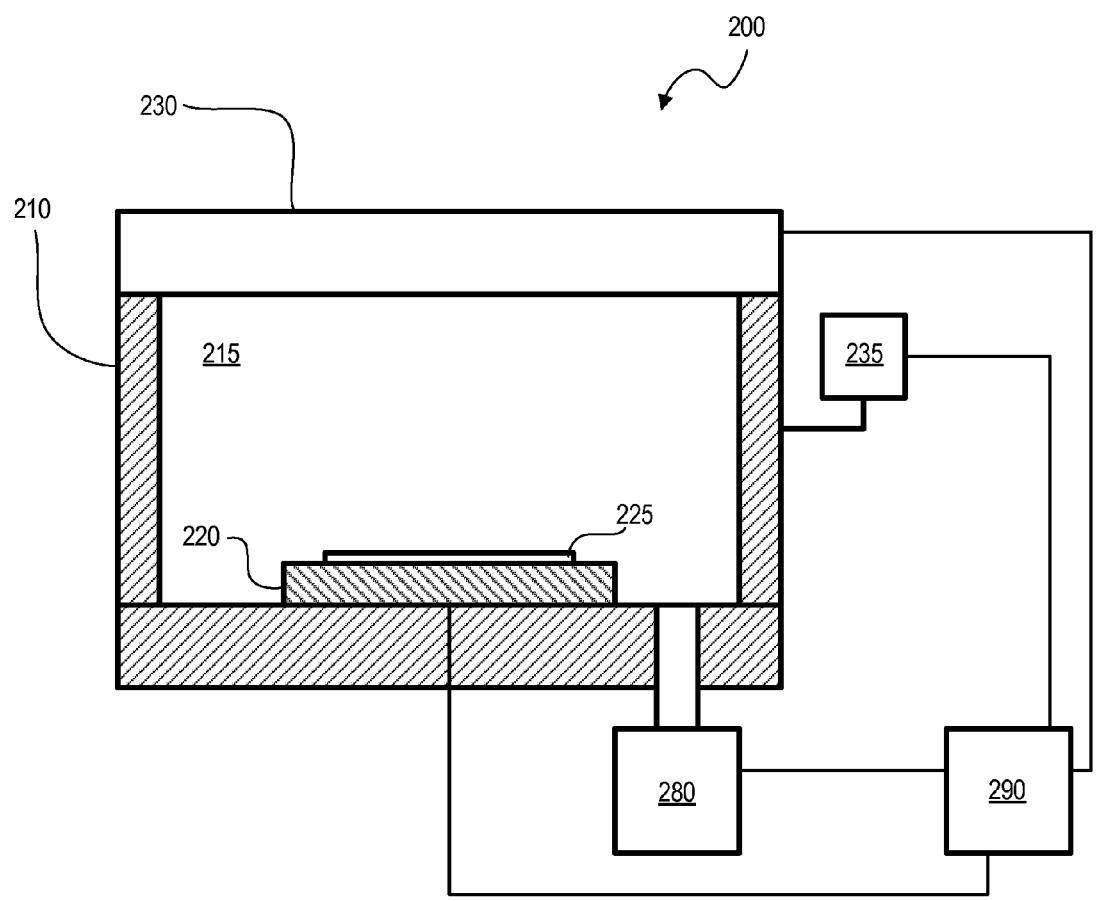
FIG. 2 is a simplified schematic representation of a plasma processing system according to embodiments disclosed herein.

Plasma processing can be executed using a plasma processing system such as a slotted plane antenna system that creates plasma via surface wave transmission of microwaves generated from radio frequency power. Plasma processing systems are known. FIG. 2 is a simplified schematic diagram of an example plasma processing system 200. As seen in FIG. 2, the plasma processing system 200 comprises a gas supply system 235 coupled to the processing chamber 110 and configured to introduce a process gas to process space 215. The process gas may comprise mixtures of gasses as described above. The plasma processing system 200 can be used for etching or heating or other treatments by adjusting system parameters, Furthermore, the plasma processing system 200 includes a pumping system 280 coupled to the processing chamber 210, and configured to evacuate the processing chamber 210, as well as control the pressure within the processing chamber 210. Optionally, the plasma processing system 200 further includes a control system 290 coupled to the processing chamber 210, the substrate holder 220, the plasma source 230, the gas supply system 235, and the pumping system 280. The control system 290 can be configured to execute a process recipe for performing at least one of an etch process and a deposition process in the plasma processing system 200. The plasma processing system 200 may be configured to process substrates of various sizes.

The processing chamber 210 is configured to facilitate the generation of plasma in process space 215, and generate process chemistry in process space 215 adjacent a surface of the substrate 225. Once plasma is formed in the process space 215, heated electrons can collide with molecules in the process gas causing dissociation and the formation of reactive radicals for treating a substrate.

Figure 3:
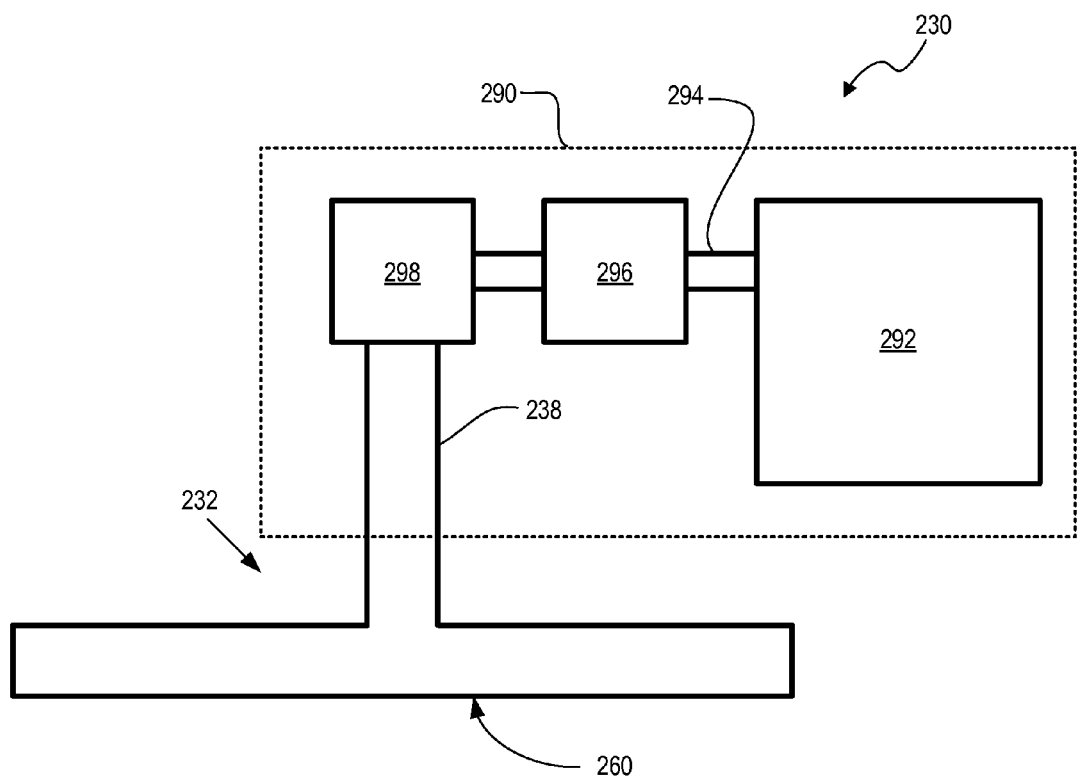
FIG. 3 is a simplified schematic representation of a surface wave plasma (SWP) source that can be used for the plasma processing system depicted in FIG. 1 in accordance with one embodiment.

Referring now to FIG. 3, a schematic representation of a SWP source 230 is provided according to an embodiment. The SWP source 230 comprises an electromagnetic (EM)

wave launcher 232 configured to couple EM energy in a desired EM wave mode to a plasma by generating a surface wave on a plasma surface 260 of the EM wave launcher 232 adjacent plasma. Furthermore, the SWP source 230 comprises a power coupling system 290 coupled to the EM wave launcher 232, and configured to provide the EM energy to the EM wave launcher 232 for forming the plasma.

The EM wave launcher 232 includes a microwave launcher configured to radiate microwave power into process space 215 (see FIG. 2). The EM wave launcher 232 is coupled to the power coupling system 290 via coaxial feed 238 through which microwave energy is transferred. The power coupling system 290 includes a microwave source 292, such as a 2.45 GHz microwave power source. Microwave energy generated by the microwave source 292 is guided through a waveguide 294 to an isolator 296 for absorbing microwave energy reflected back to the microwave source 292. Thereafter, the microwave energy is converted to a coaxial TEM (transverse electromagnetic) mode via a coaxial converter 298. A tuner may be employed for impedance matching, and improved power transfer. The microwave energy is coupled to the EM wave launcher 232 via the coaxial feed 238, wherein another mode change occurs from the TEM mode in the coaxial feed 238 to a TM (transverse magnetic) mode.

Figure 4:
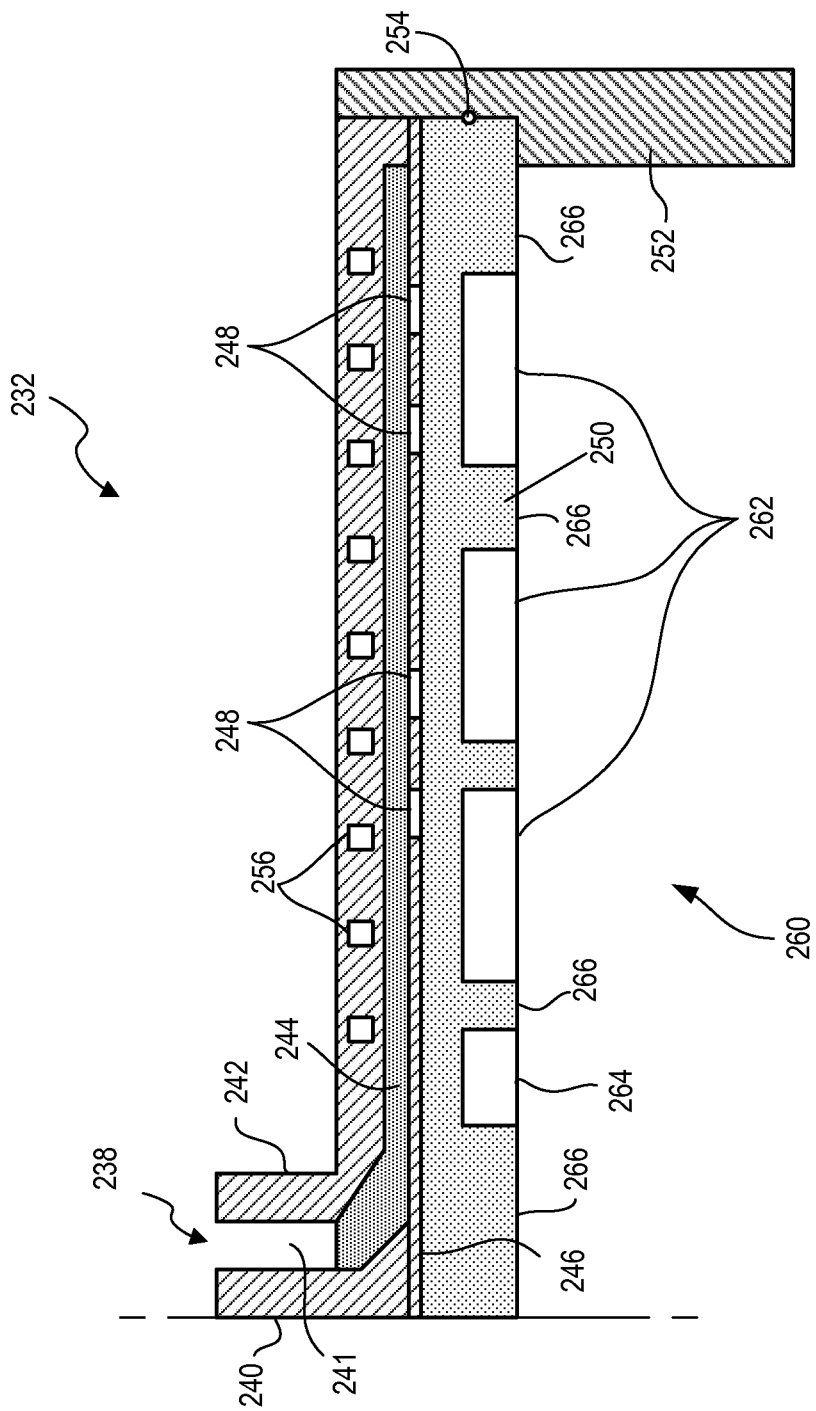
FIG. 4 is a schematic cross-sectional view of an electromagnetic (EM) wave launcher according to one embodiment.
Figure 5:
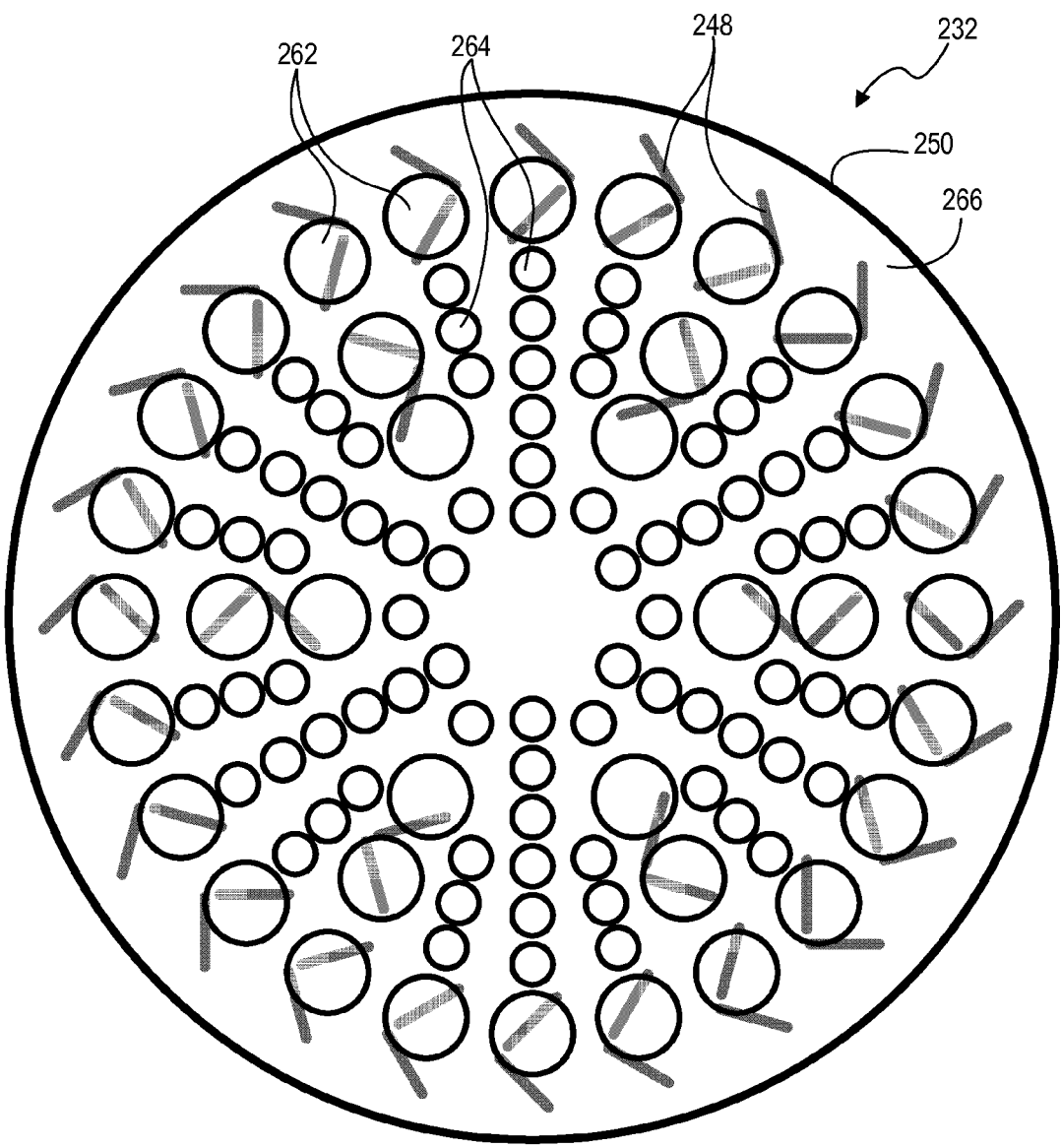
FIG. 5 is a bottom view of the EM wave launcher depicted in FIG. 4.

Referring now to FIGS. 4 and 5, a schematic cross-sectional view and a bottom view, respectively, of EM wave launcher 232 are provided according to an embodiment. The EM wave launcher 232 comprises the coaxial feed 238 having an inner conductor 240, an outer conductor 242, and insulator 241, and a slot antenna 246 having a plurality of slots 248 coupled between the inner conductor 240 and the outer conductor 242 as shown in FIG. 4. The plurality of slots 248 permits the coupling of EM energy from a first region above the slot antenna 246 to a second region below the slot antenna 246. The EM wave launcher 232 may further comprise a slow wave plate 244, and a resonator plate 250.

The number, geometry, size, and distribution of the slots 248 are all factors that can contribute to the spatial uniformity of the plasma formed in process space 115 (see FIG. 1). Thus, the design of the slot antenna 246 may be used to control the spatial uniformity of the plasma in process space 115.

As shown in FIG. 4, the EM wave launcher 232 may comprise a fluid channel 256 that is configured to flow a temperature control fluid for temperature control of the EM wave launcher 232. Although not shown, the EM wave launcher 232 may further be configured to introduce a process gas through the plasma surface 260 to the plasma.

Referring still to FIG. 4, the EM wave launcher 232 may be coupled to an upper chamber portion of a plasma processing system, wherein a vacuum seal can be formed between an upper chamber wall 252 and the EM wave launcher 232 using a sealing device 254. The sealing device 254 can include an elastomer O-ring.

The EM wave launcher 232 is fabricated with a first recess configuration 262 formed in the plasma surface 260 and a second recess configuration 264 formed in the plasma surface 260 according to one embodiment.

The resonator plate 250 comprises a dielectric plate having a plate diameter and a plate thickness. Therein, the plasma surface 260 on resonator plate 250 comprises a planar surface 266 within which the first recess configuration 262 and the second recess configuration 264 are formed. Alternatively, the resonator plate 250 comprises an arbitrary geometry. Therein, the plasma surface 260 may comprise a non-planar surface within which the first recess configuration and the second recess configuration are formed (not shown). For example, the non-planar surface may be concave, or convex, or a combination thereof.

Additional details regarding the design of plasma processing systems that can be used with method herein can be found in U.S. Pat. No. 8,415,884, entitled "Stable surface wave plasma source," the content of which is herein incorporated by reference in its entirety.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming an interfacial passivation layer on a semiconductor layer of a substrate, the method comprising:
depositing an insulation layer on a semiconductor layer of a substrate, the insulation layer having a dielectric constant value greater than approximately 5;
disposing the substrate on a substrate holder in a plasma processing system, the plasma processing system having a slotted plane antenna that creates plasma via surface wave transmission of electromagnetic radiation;
flowing a process gas mixture into the plasma processing system, the process gas mixture comprising a hydrogen gas and an oxygen gas, wherein a ratio of the hydrogen gas to the oxygen gas is greater than about ten to one; and forming an interfacial passivation layer between the semiconductor layer and the insulation layer by forming a plasma from the process gas mixture such that the insulation layer is exposed to the plasma, with the substrate maintained at a temperature less than about 380 degrees Celsius.

2. The method of claim 1, wherein the hydrogen gas is H2.

3. The method of claim 2, wherein the oxygen gas is O2.

4. The method of claim 1, wherein the process gas mixture comprises a noble gas.

5. The method of claim 4, wherein the oxygen gas comprises less than about five percent of the process gas mixture.

6. The method of claim 1, wherein the insulation layer is a gate insulator of a field effect transistor.

7. The method of claim 6, wherein the insulation layer is selected from the group consisting of aluminum oxide, hafnium oxide (HfO2), zirconium oxide (ZrO2), and titanium oxide (TiO2).

8. The method of claim 1, wherein the semiconductor layer is a channel of a field effect transistor.

9. The method of claim 8, wherein the semiconductor layer comprises germanium.

10. The method of claim 9, wherein the semiconductor layer comprises doped germanium.

11. The method of claim 8, wherein the semiconductor layer comprises a III-V compound.

12. The method of claim 1, wherein the interfacial passivation layer comprises germanium oxide.

13. The method of claim 1, wherein the slotted plane antenna creates plasma via surface wave transmission of microwaves generated from radio frequency power.

14. The method of claim 1, wherein:

the interfacial passivation layer is formed after depositing the insulation layer on the semiconductor layer;

wherein the interfacial passivation layer is formed without a metal catalyst positioned on the insulation layer; and wherein forming the plasma from the process gas mixture includes forming hydrogen radicals such that the insulation layer being exposed to the plasma causes annealing or dopant activation.

15. A method of forming an interfacial passivation layer on a germanium semiconductor layer of a substrate, the method comprising:

depositing a gate insulation layer on a germanium semiconductor layer of a substrate, the gate insulation layer having a dielectric constant value greater than about 5;

disposing the substrate on a substrate holder in a plasma processing system, the plasma processing system having a slotted plane antenna that creates plasma via surface wave transmission;

flowing a process gas mixture into the plasma processing system, the process gas mixture comprising hydrogen gas and oxygen gas, and a noble gas, wherein a ratio of the hydrogen gas to the oxygen gas is greater than about ten to one; and forming an interfacial passivation layer of germanium oxide between the germanium semiconductor layer and the gate insulation layer by forming a plasma from the process gas mixture such that the insulation layer is exposed to the plasma, the plasma and/or substrate being maintained at a temperature less than about 380 degrees Celsius.

16. The method of claim 15, wherein:

the interfacial passivation layer is formed after depositing the insulation layer on the semiconductor layer;

wherein the interfacial passivation layer is formed without a metal catalyst positioned on the insulation layer; and wherein forming the plasma from the process gas mixture includes forming hydrogen radicals such that the insulation layer being exposed to the plasma causes annealing or dopant activation.

* * * * *